United States Patent
Blanc

(10) Patent No.: US 8,193,492 B2
(45) Date of Patent: Jun. 5, 2012

(54) METHOD FOR EXCITING A MOBILE ELEMENT OF A MICROSTRUCTURE

(75) Inventor: Henri Blanc, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 203 days.

(21) Appl. No.: 12/817,252

(22) Filed: Jun. 17, 2010

(65) Prior Publication Data

US 2010/0320383 A1  Dec. 23, 2010

(30) Foreign Application Priority Data

Jun. 18, 2009  (FR) ..................................... 09 02954

(51) Int. Cl.
*H03L 1/00* (2006.01)

(52) U.S. Cl. .................. 250/307; 250/492.1; 250/492.2; 250/492.22; 331/116 M; 331/154; 331/186

(58) Field of Classification Search .................. 250/307, 250/492.1, 492.2, 492.22; 331/116 M, 154, 331/186

See application file for complete search history.

(56) References Cited

U.S. PATENT DOCUMENTS

| 7,245,801 | B2* | 7/2007 | Boyd et al. ....................... 385/27 |
| 7,358,822 | B2* | 4/2008 | Aubin et al. .............. 331/116 M |
| 7,824,943 | B2* | 11/2010 | Lutz et al. ....................... 438/48 |
| 7,843,283 | B2* | 11/2010 | Reichenbach et al. ........ 333/186 |
| 7,847,649 | B2* | 12/2010 | Van Beek et al. ............. 331/154 |
| 8,043,513 | B2* | 10/2011 | Milanovic et al. ................. 216/2 |
| 8,044,737 | B2* | 10/2011 | Mohanty et al. .............. 331/156 |
| 8,058,952 | B2* | 11/2011 | Van Beek et al. ............. 333/186 |
| 8,111,108 | B2* | 2/2012 | Gaidarzhy et al. ............ 331/154 |
| 2006/0027290 | A1* | 2/2006 | Iguchi et al. ................... 148/241 |
| 2009/0121808 | A1* | 5/2009 | Van Beek et al. ............. 333/186 |
| 2010/0320383 | A1* | 12/2010 | Blanc ............................ 250/307 |
| 2011/0043405 | A1* | 2/2011 | Reichenbach et al. ......... 342/368 |
| 2011/0067985 | A1* | 3/2011 | Gabriel et al. ................. 200/181 |
| 2011/0309553 | A1* | 12/2011 | Huff .............................. 264/400 |

* cited by examiner

*Primary Examiner* — David A Vanore

(74) *Attorney, Agent, or Firm* — Occhiuti Rohlicek & Tsao LLP

(57) ABSTRACT

The invention pertains to a method for exciting a resonant element of a microstructure, this element being mobile according to one degree of freedom. The method comprises a step for applying a charged particle beam to said microstructure, the beam being configured so as to drive the element in an alternating motion depending on its degree of freedom.

17 Claims, 2 Drawing Sheets

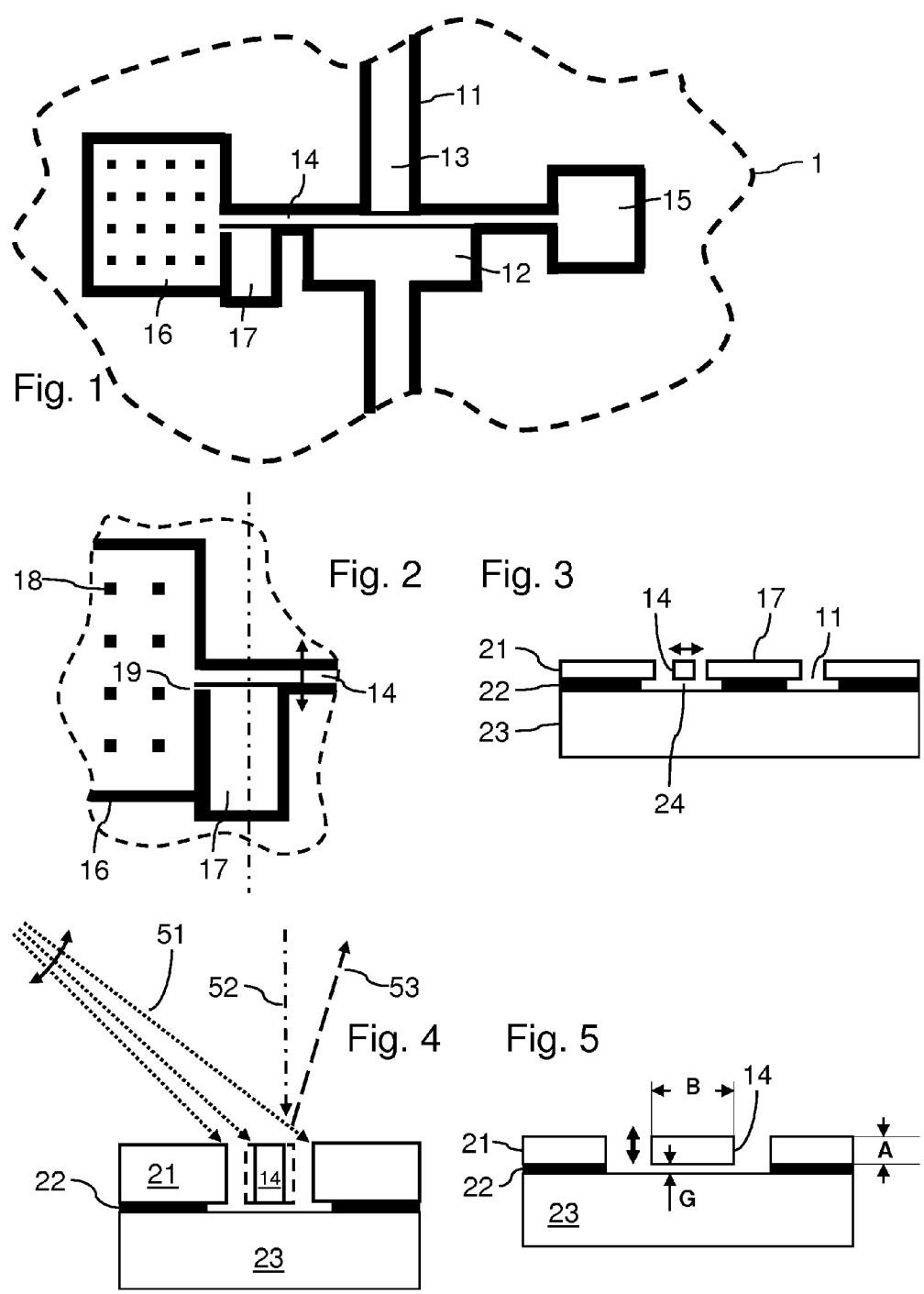

METHOD FOR EXCITING A MOBILE ELEMENT OF A MICROSTRUCTURE

CROSS-REFERENCE TO RELATED APPLICATIONS

This application claims the benefit of the priority date of French Application No. 0902954, filed on Jun. 18, 2009. The content of the application are hereby incorporated by reference in its entirety.

BACKGROUND OF THE INVENTION

1. Field of the Invention

The invention pertains to sensors formed in microstructures or nanostructures, and especially to the tests for validating the working of such sensors.

An increasing number of items used in daily life integrate chips provided with micro-electro-mechanical systems (MEMS) or nano-electro-mechanical systems (NEMS). Accelerometers or gyrometers in particular include inertial MEMS sensors.

With the improvement of silicon-etching methods and the search for greater circuit densities, chips integrating nano-electro-mechanical systems are undergoing many developments. A nanosystem may include especially a resonant sensitive sensor element. The sensitive element is often integrated into a CMOS architecture and is generally associated with an excitation electrode and a measuring electrode. The sensitive element is mobile with one degree of freedom for which it has a resonance frequency. The sensitive element has one of its dimensions typically ranging from 50 to 500 nm. This reduction of scale of the sensitive elements is supposed to increase their density of integration in wafers, for example silicon wafers, as well as their performance and thus reduces the unit cost of each chip. The integrity and the properties of the sensitive elements must however be tested throughout the manufacturing process. A simple visual control by an electronic scanning microscope proves to be insufficient to determine whether a sensitive element is functional. The tests thus aim at determining the resonance frequency and the quality factor of the sensitive element. The tests comprise firstly the excitation of the sensitive element and, secondly, measurements of motion of the sensitive element.

2. Description of the Prior Art

A known technique used to excite sensitive elements uses an electronic testing apparatus provided with special tips.

This technique is the only one used for sensors formed in a top-down approach on an entire silicon wafer, i.e. the wafer before the different chips are separated from one another. Each excitation electrode is provided with a contact against which a tip of the test apparatus comes into electrical contact. The tips apply AC voltage to the contacts to generate a movement of the sensitive parts according to their degree of freedom. However, each contact occupies a surface area that is approximately 20 to 100 times greater than the surface area of a sensitive element. A reduction in the dimensions of the sensitive elements therefore does not increase the integration density except in a small measure, and the limiting elements then become the contacts.

The contacts may be re-used to connect an associated electronic circuit. This means that the contacts are functional during the lifetime of the chip. However, in technologies where the electronic circuitry is made in the same silicon wafer as the sensitive elements (using what are called 'in IC' technologies), these contacts no longer have any functional utility during the lifetime of the chip. Furthermore, the formation of such contacts calls for numerous technological steps, giving rise to excess cost and an increase in the duration of the manufacturing process. The number of technological steps used to form the contacts may even be greater than the number needed to form the sensitive elements themselves. The contacts are usually shaped at the beginning of the chip-manufacturing process. The formation of the contacts however induces many random factors in the subsequent making of the sensitive elements, which is a more difficult operation, and this increases the discard rate. The presence of metal in the contacts is also a limiting factor for the remaining part of the manufacturing process. The contacts are themselves a non-negligible source of parasitic phenomena during the test: these contacts may induce parasitic capacitances with a magnitude that may be several hundreds of times greater than the value of the detection capacitance of a capacitive sensitive element.

In chip layouts on a same wafer (in IC technology), the sensitive elements may have no dedicated contacts. Connection tracks of the integrated circuit are then used to excite the sensitive elements. An architecture of this kind then cannot be used to test the sensitive elements independently of the integrated circuit. It is then impossible to separate causes of malfunction or to verify the effect of the integrated circuit on the functioning of the sensitive elements.

To form sensors using the bottom-up process, the problems encountered during the test phases are even more inconvenient. The sensitive elements made in the bottom-up approach are generally smaller in size and their performance characteristics are more difficult to measure. In experimental embodiments, such sensitive elements are made before the contacts are formed. In practice, it proves to be almost impossible to then form the contacts without destroying the sensitive elements, because of the brittleness of these sensitive elements. The contacts furthermore induce parasitic capacitances whose magnitude is even more of an inconvenience than it is for sensors made in the bottom-up approach.

The techniques of optical measurement of the excited sensitive elements prove to be unsuited for microstructures and even more so for nanostructures. The optical beams indeed have a minimum size of about five micrometers, which may correspond to several times the size of the sensitive element in motion.

A number of studies thus propose the use of a scanning electronic microscope to measure the excited sensitive element. Such microscopes emit an electron beam whose size may be reduced to 5 nm. The publication by Gilles Megherbi, Raynaud, Parrain, Mathias, Leroux and Bosseboeuf "Scanning electron microscopy for vacuum quality factor measurement of small-size MEMS resonators" 3 Dec. 2007, describes especially different methods of measurement implemented in a scanning electronic microscope. The excited sensor is subjected to an electron beam emitted by the microscope. The impact of this beam induces an emission of secondary electrons by the sensor. These secondary electrons are received by a detector and analyzed in such a way as to identify a shift of the excited sensor. Parameters of the sensors such as the amplitude of its shift or the resonance frequency of the sensitive element could be determined. However, a measuring method of this kind has drawbacks.

Furthermore, most testing methods cannot be implemented except at a very late stage in the manufacturing process, where the excitation of a sensitive element implies for example a preliminary connection of the functional electron circuits in implantations on a same wafer. Thus, most of the steps of the manufacturing method must be executed before any detection of a defect affecting the first steps. Furthermore, it is difficult to systematically determine the reliability of an excitation by electrical contact.

SUMMARY OF THE INVENTION

The invention is aimed at resolving one or more of these drawbacks. The invention thus pertains to a method for exciting a resonant element of a microstructure, this element being mobile according to one degree of freedom, the method comprising a step for applying a charged particle beam to said microstructure, the beam being configured so as to drive the element in an alternating motion depending on its degree of freedom.

In one variant, the particle beam is applied to said element to drive it by a mechanical effect according to said alternating motion.

According to yet another variant, the particle beam is applied to said element at an incidence having a component parallel to said degree of freedom.

According to another variant, the angle of the beam is smaller than 45° relative to said degree of freedom.

According to yet another variant, the microstructure furthermore has a conductive excitation device placed in the vicinity of said resonant element, the particle beam being applied to the excitation device so as to drive the resonant element according to said alternating motion by capacitive effect between the resonant element and the excitation device.

According to one variant, the conductive excitation device comprises an excitation electrode facing the element and a conductive unit electrically connected to the excitation electrode, the particle beam being applied to said conductive unit.

According to yet another variant, the excitation device comprises an electrical circuit connecting the excitation electrode to ground and having an electrical impedance used to drive the resonant element at its resonance frequency.

According to one variant, the microstructure is positioned in a vacuum chamber during the excitation of the element.

According to yet another variant, said beam has temporally variable properties so that it drives the element in said alternating motion.

According to one variant, the properties of the beam vary temporally either through the shifting of the beam relative to the microstructure so that this microstructure receives the particle beam alternately or through the keeping of the beam fixed relative to the microstructure and applying a beam of variable intensity.

According to yet another variant, the variable properties of the beam comprise the speed of the charged particles, the angle of the beam relative to the degree of freedom or the amplitude of the beam.

According to yet another variant, the properties of the beam vary temporally with a variable frequency included within a range of frequencies including the supposed resonance frequency of the motion of the resonant element according to its degree of freedom.

According to yet another variant, one of the dimensions of said element is submicronic.

The invention also concerns a method for testing an element of a microstructure comprising the excitation of said element according to the above-described excitation method and furthermore comprising the measurement of the resonance frequency of said element according to its degree of freedom.

According to one variant, the measurement of the resonance frequency comprises:

the application of another charged particle beam to said element, said beams having distinct angles of incidence.

the detection of charged particles emitted by said element during the application of the other beam.

According to yet another variant, said microstructure is made in a wafer including several similar microstructures, and in which several of said microstructures are tested sequentially.

According to another variant, said microstructures are tested sequentially while said wafer is held in a vacuum chamber.

BRIEF DESCRIPTION OF THE DRAWINGS

Other features and advantages of the invention shall appear more clearly from the following description that is given by way of an indication and is in no way restrictive, and is made with reference to the appended drawings of which:

FIG. 1 is a top view of an example of a microstructure to be tested;

FIG. 2 is a detailed view of the microstructure of FIG. 1;

FIG. 3 is a view in section of the microstructure of FIG. 1;

FIG. 4 is a view in section of the microstructure of FIG. 1 during a test method according to one embodiment on the invention;

FIG. 5 is a view in section of a microstructure having another degree of freedom;

MORE DETAILED DESCRIPTION

Figure 6:
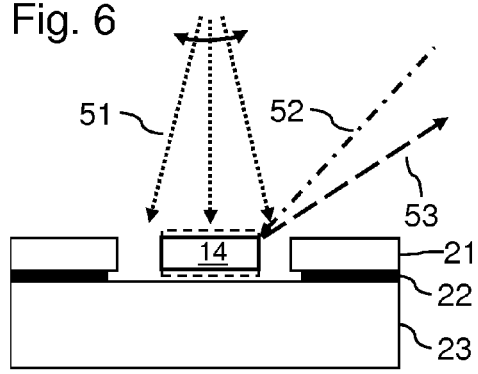
FIG. 6 is a view in section of the microstructure of FIG. 5 during a testing method according to one embodiment of the invention.

Usually, an observation made with a scanning electronic microscope generates an electrostatic charge that induces a pre-stressing of a resonant element which vitiates the test results. The invention surprisingly proposes to excite the resonant element of the microstructure with a charged particle beam. This particle beam is applied to the resonant element so as to drive it in an alternating motion along one degree of freedom. The beam could be applied for example alternately to the element by shifting the beam relative to the element (by scanning of the element) or by modulating the emission of particles of the beam.

Such a method is used to excite the resonant element without electrical contact with external contacts, and thus reduce the size occupied by the microstructure. The introduction of parasitic capacitances is very seriously reduced and the sensitivity of the excitation to these parasites is very greatly reduced. The excitation is also independent of any functional circuit attached to the resident element. Furthermore, the invention makes it possible if necessary to excite the resonant element according to two distinct methods in order to crosscheck the results of the tests. Charged particle beams can be made with dimensions that are fine enough for them to be focused on an appropriate location of the resonant element.

FIG. 1 is a top view of an example of a microstructure 1 made in a silicon wafer. This microstructure 1 has a sensor. The sensor has different components demarcated by an etching 11 of the silicon wafer. The sensor comprises especially a resonant element 14. The resonant element 14 is embedded at both ends respectively in a mobile mass 16 and a block 15. The resonant element 14 has the shape of a blade whose axis joins the mobile mass 16 to the block 15. The sensor comprises an excitation electrode 13 and a measurement electrode 12 positioned on either side of the median part of the resonant element 14. The resonant element 14 is separated from the electrodes 12 and 13 by a gap defined by the etching 11. The sensor also has a block 17 to which the mobile mass 16 is connected by means of a flexible hinge element or flexible link 19.

As illustrated in FIG. 3, the sensor can be implanted in a silicon wafer. This silicon wafer illustrated is made by silicon-on-insulator technology. The silicon wafer has a silicon substrate layer 23 on which an insulator layer 22 of $SiO_2$ is made. An additional layer of silicon 21 is made on the insulator layer 22. The etching 11 goes through the silicon layer 21 and the insulator layer 22. Thus, the etching 11 electrically insulates different components of the sensor. The etching 11 can be made in a manner known per se by a photolithography process.

In order to provide certain components made in the silicon layer 21 with mobility relative to the substrate 23, recesses 24 are created beneath these components. Thus, the insulating layer 22 is removed between the resonant layer 14 and the substrate 23 and between the mobile mass 16 and the substrate 23. The element 14 and the mobile mass 16 are thus mobile in the plane of the silicon layer 21. The recesses 24 can be formed in a manner known per se by an isotropic chemical etching. In a manner known per se, the mobile mass 16 has orifices 18 going through the silicon layer 21. Thus the insulating layer 22 can be removed beneath the entire mobile mass 16 during the isotropic chemical attack process, despite its greater section in the plane of the layer 21. On the contrary, the blocks 15 and 17 as well as the electrodes 12 and 13 are embedded in the substrate 23 by means of the insulating layer 22.

The resonant element 14 and the mobile mass 16 are mobile in the plane of the silicon wafer. The median part of the element 14 is mobile in translation perpendicularly to its axis, as illustrated by the arrows in FIGS. 2 and 3. The dimensions and the material of the resonant element 14 as well as the mass and the forces applied to the mobile mass 16 define a resonance frequency of the element 14 according to this degree of freedom. At this resonance frequency, the amplitude of the shift of the resonant element 14 is the maximum for a given excitation energy provided by the electrode 13.

In operation, the excitation electrode 13 is powered by an alternating voltage by means of metal contacts in order to induce an alternating motion of the element 14. The element 14 is in a capacitive coupling with the measurement electrode 12. A circuit not shown is used to measure the frequency and amplitude of the vibration of the element 14 when the microstructure 1 is in operation in a manner known per se. This frequency and this amplitude vary as a function of the motion of the mobile mass 16. The microstructure 1 illustrated is at an intermediate stage of its manufacturing method. The microstructure is thus without metal contacts for the electrodes 12 and 13.

FIG. 4 represents a method for testing a microstructure. A charged particle beam, for example an electron beam 51, is applied to the element 14 in a vacuum chamber. The electron beam 51 generates a pressure on the element 14. The pressure exerted presents a component parallel to the degree of freedom of the element 14. The density of the beam 51 and the speed of the electrons will be fixed at a level sufficient to induce a motion of the element 14. The beam 51 is thus configured to exert pressure that is variable according to the degree of freedom of the element 14. It is thus possible to generate an alternating motion of the element 14 by the sequential application of the beam 51 to the element. In the example illustrated, the sequential application of the beam is obtained by deflection of the angle of the beam 51 relative to the degree of freedom. The frequency of this deflection corresponds to the frequency at which it is desired to excite the element 14. The pressure exerted on the element 14 according to the degree of freedom is therefore variable.

Independently, as illustrated in FIG. 4, the beam 51 may be configured so as to be applied to the lateral face or faces of the element 14 and/or to the upper face of the element 14.

The beam 51 is advantageously applied with an angle that is as restricted as possible relative to the direction of shift of the element 14 in order to favor its excitation. Advantageously, this angle is smaller than 45°. Ideally, the beam 51 should be considered to be collinear with the direction of shift of the element 14.

Although the example illustrates a variation of the angle of the beam 51 to induce a motion of the element 14, other parameters of the beam 51 may be varied temporally in order to induce this motion.

It is generally possible to envisage, on the one hand, a shift of the beam 51 relative to the element 14, in order to exert or not exert force on at least one face of the element 14, the beam 51 preferably emitting continuously. It is also possible to envisage, on the other hand, a beam 51 that is fixed relative to the element 14, where the beam has an emission (in other words an intensity) that is variable that can even be zero. It is possible especially to apply a chopped beam of fixed position 51 relative to a face of the element 14. The chopping (or variation of intensity) will then be made at the desired excitation frequency.

The excitation frequency of the element 14 could especially be modulated on a predefined range of frequencies including the assumed resonance frequency of the element 14. In exciting the element 14 on this range of frequencies, it is possible to determine whether it is functional and determine the resonance peak of its motion according to its degree of freedom.

With the beam 51 exerting a mechanical force on the element 14, the excitation of the element 14 does not require any electrical powering of the microstructure 1. Measuring the resonance frequency of the element 14 requires only its mechanical integrity and does not make use of the electrical connections of the sensor. This excitation method can thus be obtained at a very early stage in the manufacture of the microstructures, especially before the metal electrical contacts are formed. A possible malfunctioning of the photolithography process or of the chemical etching process can therefore be detected very early, before the defective silicon wafer is subjected to the subsequent technological steps.

Advantageously, a detection beam 52 is applied to the element 14 at an orientation different from that of the beam 51. The beam 52 induces an emission of the beam, for example of secondary electrons 53, whose properties vary as a function of the position of the element 14. During its shift, the beam 52 alternately touches and does not touch the element 14. Depending on the presence and non-presence of the element 14 under the beam 52, the element 54 will alternately generate and not generate the secondary electron beam 53. This alternation could also be measured by a detector in a manner known per se.

The detection beam 52 will be applied optimally along a direction perpendicular to the degree of freedom of the element 14 in order to generate greater contrast between the reflection by the element 14 and the scattering or reflection by another component. The detection beam 52 is preferably applied at the limit or boundary at rest between the element 14 and the gap in order to optimize a variation of the detection signal. The dissociation of the excitation beam 51 and of the detection beam 52 thus makes it possible to optimize these beams. The excitation beam 51 should especially make it possible to drive the element 14 by inducing a minimum of disturbance on the beam 53 generated by the beam 52. The detection beam 52 will therefore foster the obtaining of a beam 53 having a maximum signal-to-noise ratio.

In order to make it easier to discriminate secondary electrons generated by the beams 51 and 52, these beams will advantageously have distinct properties such as their density or the speed of the electrons emitted. It is also possible to envisage combining an ion beam with an electron beam to facilitate the discrimination of the beams 51 and 52.

Although we have described a detection of the motion of the element 14 based on a secondary electron beam, it is also possible to envisage an electrical detection by using the measurement electrode 12 when the test is done at a sufficiently late stage in the manufacturing process. Such a detection could enable a test of electrical detection without electrical excitation. The electrical detection can thus be characterized by an exclusively mechanical actuation without going through the disturbances of an electrical excitation.

Such a method of testing proves to be particularly advantageous for testing the entire silicon wafer without contact with the microstructure before the different chips are separated. The testing method can be performed systematically on each of the microstructures or by statistical sampling. For statistical sampling, the microstructures tested can be discarded if the test on these structures comprises a destructive risk. For a systematic test on an entire wafer, whatever the stage of the manufacturing process at which it is performed, the test enables the sorting out of the microstructures before they are cut out and the performing of the subsequent steps, thus providing for non-negligible gain in the manufacturing process.

The dimensions and properties of the element of FIG. 4 can be the following: a 100 nm gap between the element 14 and the electrodes 12 and 13 of 100 nm, a width of the element 14 ranging from 50 to 2000 nm according to the degree of freedom and a thickness of the element 14 (the dimension along the normal to the substrate 23) ranging from 160 nm to 4000 nm. The resonance frequency of the element could typically range from 50 kHz to 1 GHz.

FIG. 5 is a view in section of another type of a microstructure sensor implanted in a silicon wafer. As in the example of FIG. 3, the silicon wafer has a silicon substrate layer 23 on which an $SiO_2$ insulating layer 22 is laid. An additional silicon layer 21 is made in the insulating layer 22. The etching 11 crosses the silicon layer 21 and the insulating layer 22. The sensor includes a vibrating element 14 whose degree of freedom is normal to the plane of the silicon substrate 23.

A recess 24 is created beneath the resonant element 14. The element 14 is mobile perpendicularly to the plane of the silicon layer 21. The element 14 can be embedded by one of its ends and can have another end free. The nominal resonance frequency of the element 14 according to its degree of freedom is defined in a manner known per se.

The dimensions and properties of the element of FIG. 6 may be the following: a gap (G in the Figure) between the element 14 and the substrate 23 of 100 nm, a thickness of the element 14 (A in the Figure) ranging from 50 to 2000 nm along the degree of freedom and a width of the element 14 (B in the Figure) ranging from 160 nm to 4000 nm. The resonance frequency of the element could typically range from 50 kHz to 1 GHz.

FIG. 6 represents a method for testing this microstructure. An electron beam 51 is applied to the element 14 in a vacuum chamber. The electron beam 51 generates pressure on the upper face of the element 14. The pressure exerted presents a component parallel to the degree of freedom of the element 14. By application of the beam 51 with temporally varying properties, an alternating movement of the element 14 is generated. In the example illustrated, the angle of the beam 51 relative to the degree of freedom is modulated alternatively. As illustrated in FIG. 6, the beam 51 may be configured to be applied to the upper face of the element 14 and then on either side of the element 14. The pressure on the element 14 according to the degree of freedom is thus variable. The beam 51 is advantageously applied along the normal to the plane of the silicon layer 21. The angle of the beam 51 is slightly varied relative to the normal to the plane during the excitation.

A detection beam 52 is applied to the element 14 at an orientation different from that of the beam 51. The beam 52 induces an emission of a secondary electron beam 53. Depending on the position of the element 14, the angle of the beam 53 may vary, and this can be measured by a detector. During its movement, the beam 52 can also alternately touch and not touch the element 14. Depending on the position of the element 14 relative to the beam 52, the element 14 will modify the generation of the secondary electron beam 53.

Although the semiconductor material described in the above examples is silicon, the invention can also be made in wafers comprising essentially another type of material, for example another semiconducting material.

Figure 7:
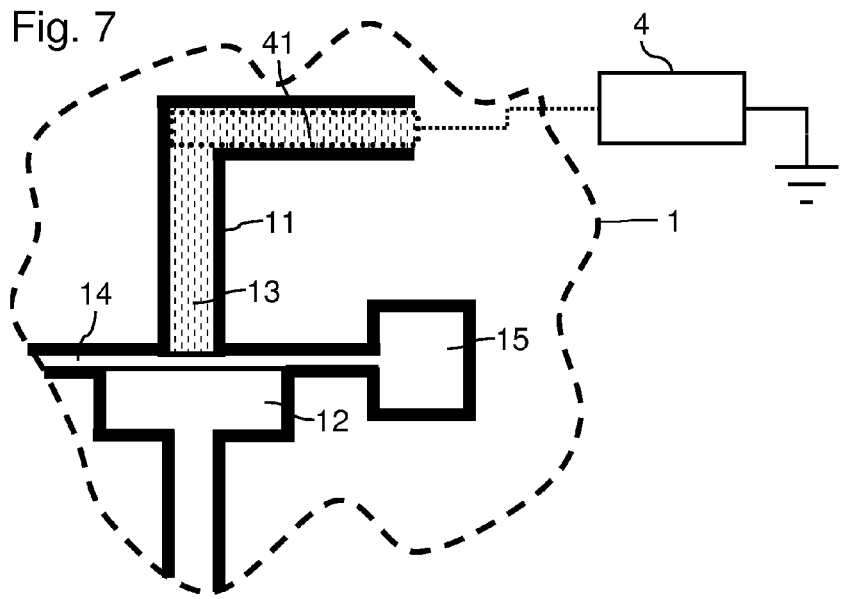
FIG. 7 is a top view of a variant of a microstructure that is to be tested.

FIG. 7 represents a variant microstructure configured to indirectly achieve an excitation of the resonant element 14 by means of the particle beam; this variant makes it possible especially to limit possible risks of deterioration during the excitation.

As it happens, the excitation beam 51 is applied to a part 41 of the metal contact of the excitation electrode 13. This metal contact and this electrode 13 form an intermediate excitation device. In this embodiment, the element 14 is shifted not by pressure exerted by the beam 51, but by capacitive effect between the electrode 13 and the resonant element 14. During the application of the beam 51 to the part 41 of the metal contact, charges are transmitted to the part 41. The excitation electrode 13 alternately accumulates these charges to generate a capacitive effect with the resonant element 14. A resonant circuit 4 connects the metal contact of the excitation electrode 13 to ground. The resonance frequency of the circuit 4 is adapted to the mechanical resonance frequency of the element 14. The circuit 4 forms a band-pass circuit about its resonance frequency. The bandwidth and the gradient of attenuation of the circuit 4 will be determined appropriately as a function of the properties of the sensor to be tested. When the properties of the beam 51 vary at a frequency approaching the resonance frequency of the circuit 4, this circuit 4 has high impedance. The potential of the excitation electrode 13 varies to induce an alternating shift of the element 14. When the properties of the beam 51 vary at a frequency that moves away from the resonance frequency of the circuit 4, this circuit 4 is shorted to ground. The excitation electrode 13 then induces no shift of the element 14. The beam 51 could for example induce an alternating excitation of the resonant element 14 either by an alternating scan by the beam 51 on the part 41 or by modulation of its intensity.

This embodiment enables the element 14 to be excited electrically without requiring contacts. The surface area occupied by the microstructure 1 is thus reduced. The surface area occupied by the metal contact of the excitation electrode 13 is indeed far smaller than the surface area of a contact for test power pads. Furthermore, while obtaining an electrical excitation of the element 14, it is possible to greatly restrict the parasitic capacitance values owing to the absence of any excitation pads. Furthermore, the circuit 4 also makes it possible to obtain passive filtering of noises at the excitation electrode 13. Such excitation could also be obtained on an entire silicon wafer. Such excitation could be combined with a detection beam such as the one described in detail here above. The interference between the excitation beam and the detection beam is then reduced.

The circuit 4 can be disconnected from the excitation electrode 13 for the functional use of the sensor. The working use of the sensor will thus not be subjected to parasites from the circuit 4. The disconnection could be obtained by any appropriate means, especially by breaking a fuse, cutting off a contact by laser or by a particle beam or again by blocking an access transistor.

Figure 8:
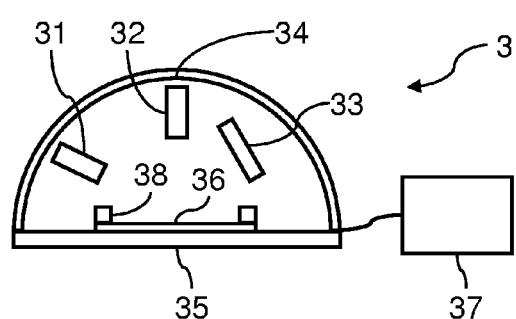
FIG. 8 is a schematic representation of a device designed to implement tests on microstructures.

FIG. 8 is a schematic view of a device 3 for testing microstructures. The device 3 comprises a generator 31 of an electron beam designed for the excitation of the microstructures. The device 3 includes a generator 32 of an electron beam designed for the detection of motions of the element 14. The device also has a secondary electron detector 33. The generators 31 and 32 as well as the detector 33 overhang a plateau 35. The generators 31 and 32 as well as the detector 33 are mobile in translation relative to the plateau 35. The generator 31 is mobile in order to induce an alternating motion of a resonant element. A support 36 provided with clamps 38 is mounted so as to be mobile relative to the plateau 35. The support 36 may for example be mounted so as to be mobile in translation along three axes or in rotation so as to place the microstructures sequentially in an appropriate manner beneath the beams. Clamps 38 are used to fix a silicon wafer that has to be tested. It is also possible to maintain the wafer in position by means of a vacuum created at the support 36. The support 36, the generators 31, 32 and the detector 33 are positioned inside a chamber 34 in order to create a vacuum. A control module is used to position and control the excitation and detection beams, control the level of the vacuum or shift the support 36 within the chamber 34. The device 3 could have a lock chamber for the robotically driven loading of silicon wafers in an industrial-scale application.

The test device 3 advantageously comprises an electronic scanning type imaging device (not illustrated) in order to obtain an image of the microstructure 1 and thus enable visual controls to position the excitation beam on an appropriate location of the element 14.

The application of the excitation beams and detection beams under vacuum is desirable for efficient operation of the excitation and detection processes. Furthermore, the vacuum is favorable to an excitation of the element 14, with low surrounding pressure facilitating the shift of the element 14 and making it possible to obtain a factor of quality as close as possible to the theoretical maximum.

Although the use of a distinct excitation beam and detection beam has been described for the performance of the test, one and the same beam can be used when the conditions are favorable. A secondary electron beam induced by the excitation beam could thus be detected. It is possible to make a detection that is synchronous in frequency with the excitation beam. The processing of the signal during the detection can then include the discrimination of the signal induced by the excitation beam relative to the variations induced by the motion of the element 14. The greater the quality factor of the element 14, the easier will it be to detect the amplitude of the signal induced by its motion.

During the application of an excitation electron beam, the direction of emission of the secondary electrons varies with the motion of the element 14. A detector can thus determine the motion of the element 14 as a function of this variation. A detector can also determine the motion of the element 14 as a function of an alternation between a reflection and a diffraction of the excitation beam. The reflection corresponds to a period during which the excitation beam is applied to the element 14, while the diffraction corresponds to a period during which the excitation beam is applied at the side of the element 14.

A beam angle that is small as compared with the degree of freedom fosters excitation but entails penalties in detection. Indeed, a detection beam is optimal if it is orthogonal to the observed degree of freedom. For an element 14 moving in the plane of the silicon wafer, a detection beam normal to this plane is thus optimal.

Although we have described methods of excitation and measurements based on electron beams, other charged particle beams may also be used. An ion beam can also be used. Other types of charges or particles could restrict parasitic effects of an electronic beam.

The methods of excitation and testing can be implemented both in an industrial-scale process and in laboratory experiments.

The invention claimed is:

1. A method for exciting a resonant element of a microstructure, the element being mobile and having one degree of freedom, the method comprising applying a charged particle beam to said microstructure, the beam being configured so as to drive the element in an alternating motion depending on its degree of freedom.

2. The method of excitation according to claim 1, wherein the particle beam is applied to said element to drive it by a mechanical effect in said alternating motion.

3. The method of excitation according to claim 2, wherein the particle beam is applied to said element at an incidence having a component parallel to said degree of freedom.

4. The method of excitation according to claim 3, wherein the angle of the beam is smaller than 45 degrees relative to said degree of freedom.

5. The method of excitation according to claim 1, wherein the microstructure further comprises a conductive excitation device placed in the vicinity of said resonant element, the particle beam being applied to the excitation device so as to drive the resonant element according to said alternating motion by a capacitive effect between the resonant element and the excitation device.

6. The method of excitation according to claim 5, wherein the conductive excitation device comprises an excitation electrode facing the element and a conductive unit electrically connected to the excitation electrode, the particle beam being applied to said conductive unit.

7. The method of excitation according to claim 6, wherein the excitation device comprises an electrical circuit connecting the excitation electrode to ground and having an electrical impedance used to drive the resonant element at its resonance frequency.

8. The method of excitation according to claim 1, wherein the microstructure is positioned in a vacuum chamber during the excitation of the element.

9. The method of excitation according to claim 1, wherein said beam has temporally variable properties so as to drive the element in said alternating motion.

10. The method of excitation according to claim 9, wherein the properties of the beam vary temporally either through the shifting of the beam relative to the microstructure so that this microstructure receives the particle beam alternately or by keeping of the beam fixed relative to the microstructure and applying a beam of variable intensity.

11. The method of excitation according to claim 9, wherein the variable properties of the beam include the speed of the charged particles, the angle of the beam relative to the degree of freedom or the amplitude of the beam.

12. The method of excitation according to claim 9, wherein the properties of the beam vary temporally with a variable frequency included within a range of frequencies including the supposed resonance frequency of the motion of the resonant element along its degree of freedom.

13. The method of excitation according to claim 1, wherein one of the dimensions of said element is submicronic.

14. A method for testing an element of a microstructure comprising the excitation of said element according to the excitation method according to claim 1, further comprising measuring the resonance frequency of said element according to its degree of freedom.

15. The method for testing according to claim 14, wherein the measurement of the resonance frequency comprises:
applying another charged particle beam to said element, said beams having distinct angles of incidence,
detecting charged particles emitted by said element during the application of the other beam.

16. The method for testing according to claim 14, wherein said microstructure is made in a wafer including several similar microstructures, and in which several of said microstructures are tested sequentially.

17. The method for testing according to claim 16, wherein said microstructures are tested sequentially while said wafer is held in a vacuum chamber.

* * * * *